United States Patent [19]

Tully

[11] Patent Number: 5,093,280

[45] Date of Patent: * Mar. 3, 1992

[54] REFRACTORY METAL OHMIC CONTACTS AND METHOD

[75] Inventor: John W. Tully, Rolling Hills Estates, Calif.

[73] Assignee: Northrop Corporation, Los Angeles, Calif.

[ * ] Notice: The portion of the term of this patent subsequent to Apr. 4, 2006 has been disclaimed.

[21] Appl. No.: 385,027

[22] Filed: Jul. 25, 1989

Related U.S. Application Data

[63] Continuation-in-part of Ser. No. 107,614, Oct. 13, 1987, abandoned.

[51] Int. Cl.⁵ .............................................. H01L 21/44
[52] U.S. Cl. ................................... 437/184; 437/189; 437/192; 437/22; 437/912; 437/944; 437/80; 148/DIG. 100; 148/DIG. 105
[58] Field of Search ............... 437/184, 912, 189, 192, 437/84, 944, 22, 80; 148/DIG. 100, DIG. 143, DIG. 105, DIG. 15

[56] References Cited

U.S. PATENT DOCUMENTS

| | | | |
|---|---|---|---|
| 4,330,343 | 5/1982 | Christou | 437/22 |
| 4,426,765 | 1/1984 | Shahriary et al. | 437/184 |
| 4,463,366 | 7/1984 | Ishii et al. | 357/22 |
| 4,464,441 | 8/1984 | Pikorz | 428/579 |
| 4,546,540 | 10/1985 | Veyanagi et al. | 437/912 |
| 4,683,487 | 7/1987 | Veyanagi | 357/49 |
| 4,729,967 | 3/1988 | Armiento | 437/184 |
| 4,745,082 | 5/1988 | Kwok | 437/912 |
| 4,745,089 | 5/1988 | Orban | 437/192 |
| 4,818,712 | 4/1989 | Tully | 437/944 |
| 4,889,831 | 12/1989 | Ishii et al. | 437/184 |
| 4,936,781 | 6/1990 | Mircea et al. | 437/22 |

OTHER PUBLICATIONS

"Thin film processes", Vossen et al., 1978, pp. 315-317.
"Gallium Arsenide Materials, Devices, and Circuits", Howes et al., pp. 219-254; pp. 163-166; pp. 178-180, 1985.
Tully et al., "A Fully Planar Heterojunction Bipolar Transistor" IEEE Electron Device Letters, vol. ED-L-7, Nov. 1986, pp. 615-617.
Ghandhi, *VLSI Fabrication Principles*, John Wiley, NY (1983) pp. 333, 437, 438,460, 461.

*Primary Examiner*—Brian E. Hearn
*Assistant Examiner*—Trung Dang
*Attorney, Agent, or Firm*—Terry J. Anderson; Robert B. Block

[57] ABSTRACT

A process for forming refractory metal ohmic contacts comprises masking a group III-V semiconductor substrate and opening windows thereon. Metal ions are implanted through the window to a sufficient concentration to connect to electronic features in the substrate. Following implantation, a refractory metal ohmic contact is deposited in the same windows and is passivated. Next, the implanted ions are activated by annealing so the refractory metal ohmic contacts are electrically connected to the electrical features in the substrate.

16 Claims, 2 Drawing Sheets

REFRACTORY METAL OHMIC CONTACTS AND METHOD

CROSS REFERENCE TO RELATED APPLICATIONS

This application is a continuation in part of my prior application Ser. No. 107,614, filed Oct. 13, 1987, now abandoned entitled REFRACTORY METAL OHMIC CONTACTS AND METHOD, which in turn is related to applications assigned to the same assignee as this invention and entitled PLANAR BIPOLAR TRANSISTORS INCLUDING HETEROJUNCTION TRANSISTORS AND METHOD, application Ser. No. 107,617, now U.S. Pat. No. 4,839,303, filed on Oct. 13, 1987, in the names of John W. Tully, Benedict B. O'Brien, William Hant, and King L. Hu, and ALUMINUM LIFTOFF MASKING PROCESS AND PRODUCT, application Ser. No. 107,626, now U.S. Pat. No. 4,818,712, filed on Oct. 13, 1987 in my name, John W. Tully. The entire contents of each of these applications and/or patents are herein incorporated by reference.

BACKGROUND OF THE INVENTION

This invention is directed to a process by which refractory metal contacts are made to various portions of a group III-V semiconductor substrate for electrical connection to different portions thereof. The process is particularly useful for formation of ohmic contacts of molybdenum and other refractory metals to ion implanted p-type gallium arsenide.

Almost every semiconductor electronic substrate has the requirement for ohmic contacts to provide electrical connection to the various electronic components thereof formed in the semiconductor substrate. The pursuit of ohmic contacts has been the subject of much study. In general, for gallium arsenide the best contacts have been fabricated by an alloy techniques where a doping species, such as zinc, is coevaporated with a more noble metal, such as gold, onto the contact area. The deposition is then heat treated for a brief period to allow the zinc to heavily dope the interface layer between the gallium arsenide and the noble metal. The drawback to this process is that the heat treatment temperature must be relatively low to limit disastrous alloying- of the noble metal with the gallium arsenide. Indeed gold forms a liquid phase with gallium arsenide at relative low temperatures of about 350° C. and is known to give rise to a non-uniform interface with the gallium arsenide.

This problem is also evident in gold alloys as for example the AuGe/Ni alloy discussed by U.S. Pat. No. 4,808,545 to Balasubramanyam et. al. This patent notes both the lateral migration and the vertical transport of gold causing electrical shorting of the devices.

Thus while gold and other noble metals may be useful for ohmic contact formation utilizing low temperature processing, in device fabrication which require subsequent high temperature processes such as sputter deposition or plasma etching, noble metals can not be used for ohmic contacts. Since high temperature processing is very advantageous in gallium arsenide device fabrication, the use of noble metal for ohmic contacts prior to the completion of all high temperature processes can not be practiced with gallium arsenide.

In silicon substrate technology, use of refractory metals such as molybdenum for contacts results in the formation of new molecular species. These new molecular species are silicides. If all of the refractory metal is not consumed in the formation of the silicide subsequent high temperature processes can result in further chemical reaction of both the base silicon substrate and any dopant species to form further silicide. This could deplete both the dopant species and the substrate and thus could change (in potentially uncontrolled manners) the characteristics of the device.

In gallium arsenide the alloying heat treatment to obtain zinc doping of an interface layer is at about 450° C. to 500° C. Use of an implanted metal ion to connect to a buried base, subsequent to the placement of an ohmic contact, requires heat treatment of the substrate to activate the metal ion implanted connector therein. When zinc is used as the implanted connector, the ion implant activation temperature is in the range of 800° C. to 900° C., and thus is incompatible with the temperature limitations of a previously applied gold-zinc or other noble metal ohmic contact.

Previous work has been done in attempting to apply molybdenum as a contact to p-type gallium arsenide. Those contacts generally were made to bulk doped gallium arsenide, and the lowest contact resistance which had been achieved was in the order of $4 \times 10^{-5}$ ohms/cm$^3$ on gallium arsenide doped at $1 \times 10^{19}$/cm$^3$. Lower contact resistance is desirable.

The above reference U.S. Pat. No. 4,808,545 conducts an ion implantation to create n+type source and drain region in a FET device. After these n+type regions are formed they are alloyed with a quarternary layer of indium, germanium, molybdenum and tungsten contact metallurgy and then capped with a silicon dioxide layer for passivation prior to a high temperature anneal and dopant activation step. This ion implantation however is not used to connect a previously buried layer to surface metalization, the ion implant does not form a p-type connecting zone, consequently ohmic contacts to p-type regions are not formed and an additional photoresist lift-off stencil masking step to define the geometry of the metalization is necessary subsequent to the ion implantation.

In a further patent also for a FET device, U.S. Pat. No. 4,463,366 to Ishii et. al., while p-type regions are formed by ion implantation and connected metalization to those regions are formed, the process of this patent requires the use of an intermediate masking step for the metalization. Even with this additional masking step the resulting metalization does not form exclusive p-type region ohmic contacts but concurrently also directly contacts n-type regions adjacent to the p-type regions with resulting Schottky junctions in the metalization directly interspaced between adjacent ohmic contacts. Further, annealing must be effected prior to metalization. Additionally an etch must be effected after the anneal but prior to the metalization. Such an etch results in removal of implant ions which migrate to the substrate surface during the anneal. A direct consequence of such ion removal is the reduction of the dopant concentration of the implant zone.

SUMMARY OF THE INVENTION

In order to aid in the understanding of this invention, it can be stated in essentially summary form that it is directed to the process for applying refractory metal ohmic contacts to group III-V semiconductor materials, and the resultant article. The process includes the steps of placing on a prepared group III–V semiconductor wafer a refractory metal at the locations where an ohmic contact is required to make contact with electronic features in the wafer. This may be followed with the placement of a passivation layer such as chromium on the refractory metal, contact.. Next, a passivation layer such as silicon nitride is placed thereon to passivate the refractory metal contact from high temperature treatment which may be required of the wafer. After thermal treatment is completed on the wafer, the silicon nitride is etched away at the ohmic contact to expose the contact. Titanium and gold are successively placed thereon for connection to contact.

It is, thus, a purpose and advantage of this invention to provide a low specific resistance ohmic contact which is useful to make contact with electronic portions of an ion implanted group III–V substrate, particularly a p-type region of said substrate and most particularly a p-type region in a gallium arsenide substrate, with contact metalization prior to thermal activation of the implanted ions.

It is another purpose and advantage of this invention to provide a coordinated process wherein a semiconductor substrate is provided with a masking layer and the same masking layer is then employed both for ion implantation and subsequent ohmic contact application, so as to provide self-aligned ohmic contacts, together with ohmic contact process steps which are compatible with the ion implant process steps.

Other purposes and advantages of this invention will become apparent from a study of the following portion of the specification, the claims and the attached drawings.

DESCRIPTION OF THE PREFERRED EMBODIMENT

Figure 1:
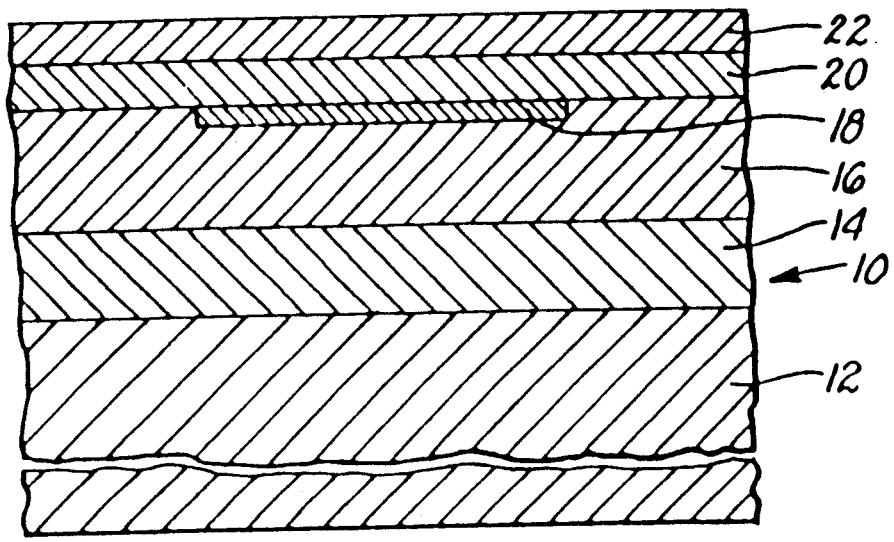
FIG. 1 is a cross-sectional view through a prepared wafer which is shown to illustrate one of the types of wafer to which refractory metal ohmic contacts can be applied in accordance with the process of this invention.

The process of this invention is useful in producing refractory ohmic metal contacts to electronic features on a variety of group III–V substrates particularly p-type features on gallium arsenide substrates. Useful as substrates are indium, arsenic, phosphorus and antimony as well as lattice matched group III–V heterosubstrates thereof further including aluminum. Useful as p-type dopants for said substrates are zinc, cadmium, magnesium and beryllium.

Such group III–V substrates include gallium arsenide, indium antimide, indium phosphide, gallium phosphide, gallium antimide, indium arsenide and suitable lattice matched heterosystems of gallium, indium antimony, phorphorus, arsenic and aluminum including as, for instance, GaAs(Al,Ga)As, GaAs-(Ga,In)P, InP-(Ga,In)(P,As) and InAs(Al,Ga)Sb.

Of the above mentioned group III–V substrates the group consisting of gallium arsenide, gallium aluminum arsenide and indium gallium arsenide are particularly advantageous. The technology of this group of substrates is advanced as to fabrication, operational parameters and uses.

Gallium arsenide devices can be fabricated which take advantage of the high speed characteristics of gallium arsenide as compared to silicon technology. The same is true with respect to gallium aluminum arsenide. Further gallium arsenide and gallium aluminum arsenide can be used to form heterojunction devices. Indium gallium arsenide provides for reduced band gap compared to indium phosphide and thus to increase wave length sensitivity. As such indium gallium arsenide is increasingly being used as a photo-detector in fiber optics.

The process of the invention is particularly useful for the preparation of devices having buried features, self-aligning devices, devices which are fully planar and high speed devices. One such device is a fully planar bipolar transistor having a buried base accessed via a p-type ion implant bearing an ohmic contact of the invention thereon.

Layers buried in the substrate are accessed via ion implantation followed by metalization to effect contact to such layers. This is effected via the use of a single mask, an implant-metalization mask. The ion implant can be effected prior to metalization or after the metalization by implanting through the metalization. Irrespective of the sequence of ion implantation and metalization, the same mask is utilized for both. Further irrespective of such implantation-metalization sequence the mask is not removed between such steps nor do separate masks have to be used for the implantation and metalization steps as are necessary in the above referenced U.S. Pat. No. 4,808,545 and 4,463,366.

After ion implant and metalization, without removal of the implant-metalization mask which can also later be used to form other features such as a self-aligned emitter, anneal of the implanted metalized substrate is effected. For implant with zinc ion, anneal can be conducted at temperature of from about 750° C. to about 920° C. for a time period sufficient to effect annealing of implant damage to the substrate thereby reactivating the substrate. Generally implant anneal will be effected from about 600° C. to about 1000° C.

Cadmium doped implants are expected to exhibit greater high temperature stability to longer annealing time periods since the larger ionic size of cadmium verses zinc renders cadmium less prone to diffusion by interstitial mechanisms. Beryllium implants are expected to exhibit less substrate damage (and thus require less anneal) than zinc because of the lighter mass of beryllium and consequently the lower implant energy required for implant.

Irrespective of the implant ion since metalization is effected over the implant region prior to anneal loss of dopant in the implanted region is curtailed. Inhibition of dopant loss is achieved directly by the metalization. The metalization essentially caps the implanted substrate region to retain the implant dopant species. This can be contrasted to the prior work of others such as the above noted U.S. Pat. No. 4,463,366 to Ishii et. al., who etch the substrate surface after anneal and thus remove any beneficial interstitial ion migration.

While I do not want to be bound by theory, it is presently believed that ion migration upon anneal contributes to improvement of the ion implanted substrate metalization interface by locally increasing the implanted dopant ion concentration at the interface of the refractory metal and the substrate. This effectively highly dopes that interface and leads to improvement of the ohmic contact resulting in lowering the resistivity of the same. Further improvement in the morphology of the alloyed contact is evident upon examination via Nomarsky phase contrast microscopy. Utilizing such microscopy it is evident that ohmic contacts formed as per this invention are uniform compared to conventional gold-based alloy contacts which exhibit non-uniform appearance.

Suitable for use to form the ohmic contacts with the ion implanted layer are the refractory metals chosen from the group of molybdenum, tungsten and tantalum with molybdenum being particularly preferred. Chromium while not useful as the refractory ohmic contact metal can be used to overlay the refractory ohmic contact metal for passivation of the same to subsequent downstream processing steps during device fabrication.

Again while I do not wish to be bound by theory it has been found with the use of refractory metals for ohmic contacts with group III-V substrates, as opposed to silicon technology wherein silicides are formed, stable contact regions are formed which can be subjected to subsequent high temperature processes Contrary to the use of silicon such high temperature process do not lead to adverse molecular formation (equivalent to silicides) of the refractory metal with either the semiconductor substrate, i.e. the group III-V substrate, or its dopant species.

For the purpose of understanding of the invention, FIGURE 1 shows an enlarged cross section through a previously prepared gallium arsenide semiconductor wafer. Wafer 10 is an example of the starting point for this process and is a heterojunction bipolar transistor wafer. Semi-insulating gallium arsenide substrate 12 has n+subcollector 14 epitaxially grown thereon. This is followed by collector layer 16 epitaxially grown thereon. Base region 18 was defined by photo-lithography and ion implanted, with a desired dopant species selectively through windows in the photolithographic mask. After removal of the photoresist layer, the wafer was reinserted into the epitaxial growth reactor where it was high-temperature annealed, and emitter layer 20 and emitter contact layer 22 were successively epitaxially grown. A section through the complete, prepared wafer is shown in FIG. 1.

Figure 2:
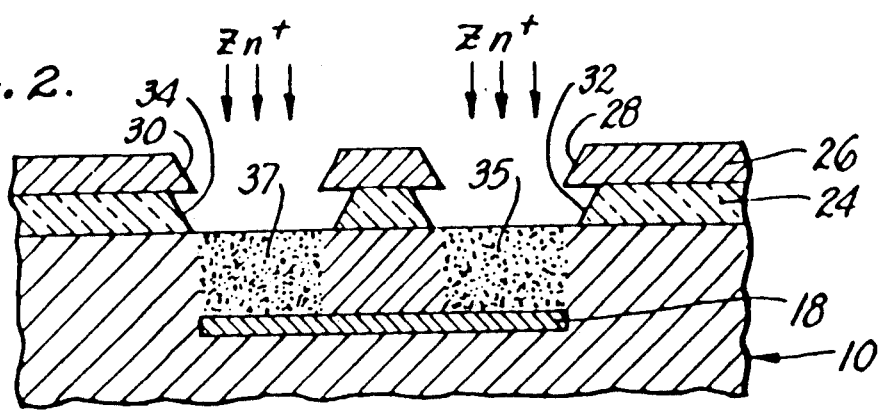
FIG. 2 is a similar section through device regions of the prepared wafer after a silicon dioxide layer and an aluminum mask layer have been deposited and windows formed therein, and showing ion implantation through the windows.

With this prepared wafer, generally indicated at 10 in FIG. 2, first a layer of silicon dioxide 24 and then a layer of aluminum 26 are successively deposited by sputter or vapor deposition, each in the order of 4,000 Angstroms thick. Photoresist is then applied and a base contact pattern exposed and developed into it.

The base contact pattern is formed to surround and isolate an island which ultimately will be the emitter region. For the purposes of illustration in the Figures a crosssection of the device through the base and emitter regions has been taken. The base contact pattern has thus been artificially divided in two with the emitter region isolated between the "two" base regions. In an actual device the "two" bases regions are joined and surround the emitter region. In describing the base region the "two" sections shown in the cross section of the Figures are individually identified however it is understood that they represent a continuous base region.

The aluminum is etched away in a commercial phosphoric acid etch or by reactive ion etching. This (in the section of the Figures) produces windows 28 and 30 in the aluminum layer. The photoresist is removed and the wafer is plasma-etched in a carbon tetrafluoride/oxygen mixture or is reactive ion-etched. This process step etches the silicon dioxide down to the semiconductor surface defining windows 32 and 34 in the silicon dioxide layer extending all the way down to the surface of the semiconductor surface.

The wafer is ion-implanted with zinc ions, or other suitable p-type ions such as other Group II metals including beryllium, cadmium, or magnesium, to provide conductive regions 35 and 37 to the buried base 18. A dosage of about $10^{19}$ metal ions/cc is used to make the conductive regions. After implantation, the wafer is dipped briefly, about 15 seconds, in hydrochloric acid diluted to 25 percent in deionized water and rinsed in deionized water. This step removes residual elemental zinc from the surface, as well as any gallium arsenide oxides, which might affect the adherence of the next applied molybdenum contact. If the previous silicon dioxide etch has not done so, after the implantation, an additional plasma etch in carbon tetrafluoride/oxygen is performed to undercut the aluminum layer 26 at the windows 28 and 30, as shown in FIG. 2.

The wafer is then immediately loaded into the molybdenum evaporator, with the one used being an ion-pumped E-beam evaporator. During pumpdown, the wafer is heated to 130° C. for 30 minutes and then allowed to cool until a good vacuum, such of the refractory metal contact is performed. The refractory as $6 \times 10^{-7}$ Torr, is achieved. At this point, the evaporation of the refractory metal contact is performed. The refractory ohmic contact metal such as molybdenum is evaporated to form layer 36. The molybdenum thickness is about 400 Angstroms.

A chromium passivation layer 38 is vapor-deposited over the molybdenum layer 36 since the molybdenum layer 36, which is used for the contact metal in the heterojunction bipolar transistor process, must be passivated against a later carbon tetrafluoride/oxygen etch. The chromium is evaporated to a thickness of about 200 Angstroms. The chromium layer 38 is followed by a sputter deposition of a layer 40 of silicon nitride. This is the structure shown in FIG. 3.

Figure 3:
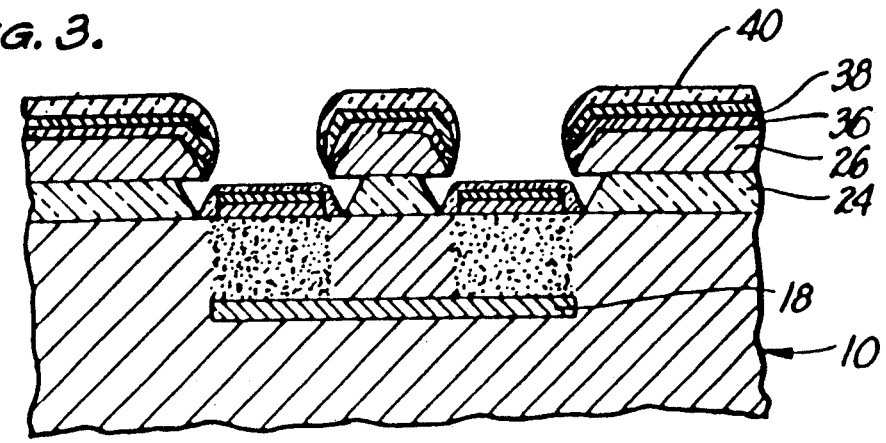
FIG. 3 is a similar section showing the further deposition of molybdenum, chromium and silicon nitride layers.

In FIG. 3 the layers of silicon dioxide and aluminum have the base contact windows therein, and the molybdenum contacts have been evaporated into the windows and passivated with the chromium and silicon nitride.

The silicon nitride, however, has not passivated on the underside of the aluminum overhang. This exposed aluminum is now etched in a potassium hydroxide solution, preferably 50 percent KOH, in deionized water This etching lifts off the aluminum layer, which carries with it the molybdenum, chromium and silicon nitride layers. Alternatively, the liftoff can be performed before the deposition of the silicon nitride.

Figure 4:
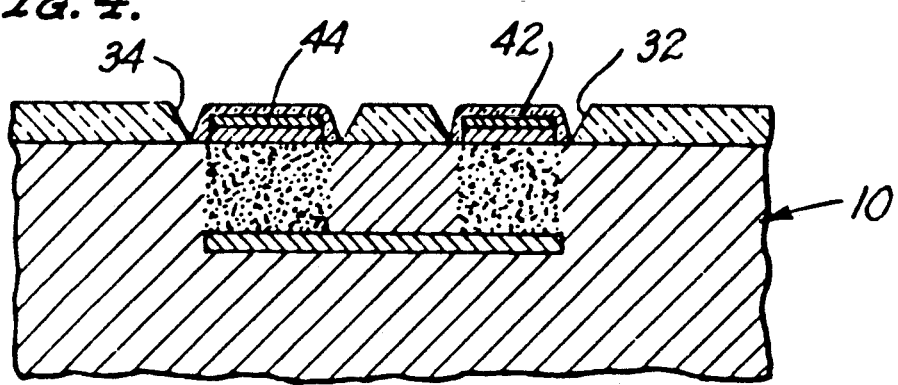
FIG. 4 is a similar section showing the removal of the masking layer, together with the layers deposited thereon.

After the liftoff, high temperature activation of the zinc ion implant is performed. Employing a commercial rapid thermal annealer, activation parameters of 800° C.

for 10 seconds are operative, but other schedules may be considered taking into account the ion type, the implant energy, implant dose, depth of implant and other implant variables as are desired for any given device fabrication. The resulting structure, with contacts in place, is seen in FIG. 4.

Figure 5:
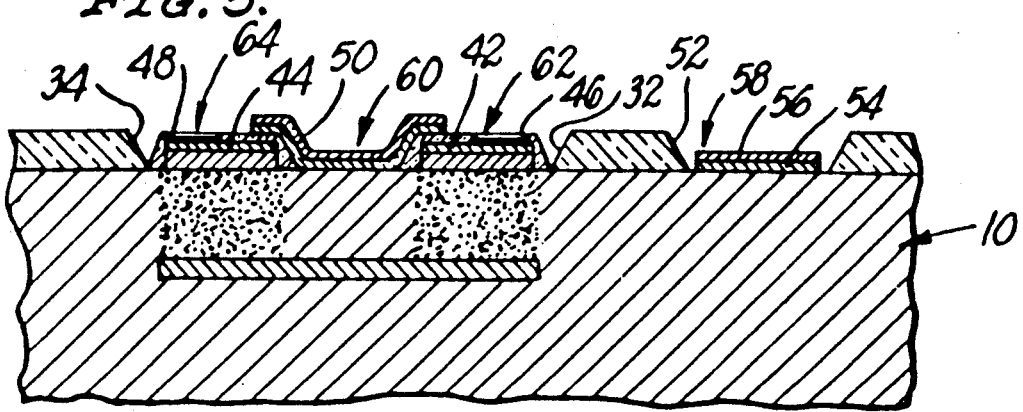
FIG. 5 is a similar section showing contact to the emitter and base made by photolithographic masking and etching followed by deposition of connector metal, with the excess metal removed by lifting off of the photoresist.

The refractory metal contacts thus described have a specific contact resistance of about $1 \times 10^{-6}$ ohms-cm$^2$ or less. As noted above, it is believed that the very low contact resistance may be a result of a very high level of the implanted species accumulating at the gallium arsenide-molybdenum interface. After the rapid thermal anneal activation, connector windows are defined by photolithography and the silicon nitride at the windows is etched away down to the molybdenum/chromium contacts 42 and 44 by means of a carbon tetrafluoride-oxygen plasma etch to provide connector windows 46 and 48, see FIG. 5.

Vias 50 and 52 are photolithographically defined and are etched through to the semi conductor. Evaporation of titanium to about 500 Angstroms thick followed by evaporation of gold to about 2,000 Angstroms thick is successively deposited in the connector windows and vias to form connector layers 54 and 56, seen in FIG. 5. Collector connector 58 and emitter connector 60 are thus formed in the vias against the top layer of the wafer. Base contact connectors 62 and 64 are formed on the base contacts 42 and 44 for external connection.

EXAMPLE I

As a specific example of the process and the resultant ohmic contacts of the invention, starting with a prepared gallium arsenide wafer, as shown in FIG. 1, a silicon dioxide layer is sputter-deposited on the top surface of the wafer to a thickness of about 4,000 Angstroms. This is followed by a sputter-deposited layer of aluminum, to about 4,000 Angstroms.

A pattern of contact windows for a heterojunction bipolar transistor were photolithically made on the aluminum layer. This pattern was then etched through the aluminum with a commercial phosphoric acid aluminum etch. The pattern was then etched through the silicon dioxide layer by reactive ion etching. The profile of the aluminum layer is such that it overhangs the silicon dioxide layer. Into this pattern of window through the aluminum and silicon layer, a zinc ion is implanted into the wafer with sufficient energy to reach the buried base in the wafer. A dosage of greater than $10^{19}$ zinc ions per cubic centimeter is necessary to make the regions conductive from the buried base to the gallium arsenide surface.

After implantation, the wafer is dipped for about 15 seconds in 25 percent hydrochloric acid and rinsed in deionized water to remove residual elemental zinc and gallium arsenide oxides from the surface. Following rinsing, the wafer is loaded into a molybdenum evaporator and is heated to 130° C. for 30 minutes. After cooling and a good vacuum is achieved, about $6 \times 10^{-7}$ Torr, evaporative deposition of the molybdenum ohmic contact is performed. The evaporated thickness is about 400 Angstroms.

Following the molybdenum ohmic contact deposition, a 200 Angstrom layer of chromium is deposited on the aluminum for the purpose of passivating the molybdenum ohmic contact against a subsequent carbon tetrafluoride/oxygen plasma etch. At this point, or after an aluminum liftoff, about 200 Angstroms of silicon nitride are sputter-deposited on the surface. This layer of silicon nitride passivates the molybdenum-chromium ohmic contact from corroding and passivates the exposed gallium arsenide from decomposition during the following high temperature activation of the zinc ion implant.

Next, the implanted zinc ion in the gallium arsenide substrate between the molybdenum contact and the buried base are activated using a rapid thermal annealer which raises the temperature to 800° C. for 10 seconds. The molybdenum ohmic base contacts can thereupon be prepared for external connection by opening windows and making connections employing successive evaporated layers of 500 Angstroms of titanium and 2,000 Angstroms of gold for external connection.

This invention has been described in its presently contemplated best mode, and it clear that it is susceptible to numerous modifications, modes and embodiments within the ability of those skilled in the art and without the exercise of the inventive faculty. Accordingly, the scope of this invention is defined by the scope of the following claims.

What is claimed is:

1. The process of forming a refractory metal ohmic contact on a group III-V semiconductor substrate comprising the steps of:
    forming an implant-metalization mask on the group III-V semiconductor substrate with at least one window in said mask,
    implanting said group III-V semiconductor substrate with a group II metal ion selected from the group consisting of zinc, beryllium, cadmium and magnesium through said window in said implant-metalization mask to form an implanted p-type conductive region in said group III-V semiconductor substrate;
    maintaining said implant-metalization mask on said group III-V semiconductor substrate,
    depositing through said window in said implant-metalization mask a refractory metal selected from the group consisting of molybdenum, tungsten and tantalum in contact with said implanted conductive region of said group III-V semiconductor substrate to form a refractory ohmic contact to said implanted conductive region of said group III-V semiconductor substrate, and
    subsequently thermally activating said implanted conductive region of said group III-V semiconductor substrate to enable said refractory ohmic contact to a specific contact resistance of less than about $10^{-6}$ ohms-cm$^2$.

2. The process of claim 1 wherein:
    said mask formation step includes the application of a silicon dioxide layer on said group III-V semiconductor substrate.

3. The process of claim 1 further wherein:
    said refractory metal is molybdenum.

4. The process of claim 1 wherein:
    the step of depositing said refractory metal comprises the successive placement of a molybdenum layer and a chromium layer by vapor deposition.

5. The process of claim 3 wherein;
    previously to said activation step, a passivation layer is deposited over said molybdenum layer.

6. The process of claim 5 wherein:
    said passivation layer includes a layer of chromium followed by a layer of silicon nitride.

7. The process of claim 1 wherein:
    said refractory metal is molybdenum; and said substrate is gallium arsenide.

8. The process of claim 7 wherein:

the depositing of said molybdenum layer is accomplished by vapor deposition; and further including the step of depositing a passivation layer over said molybdenum layer.

9. The process of claim 1 wherein:

previously to the activation step, a passivation layer is deposited on the ohmic contact.

10. The process of claim 9 wherein:

said passivation is accomplished by the vapor deposition of chromium followed by the sputter deposition of silicon nitride.

11. The process of claim 1 wherein:

said group III-V semiconductor substrate is selected from the group consisting of gallium arsenide, gallium phosphide, gallium antimide, indium arsenide, indium phosphide, indium antimide and lattice matched heterosystems of gallium, indium, antimony, phorphorus, arsenic and aluminum

12. The process of claim 1 wherein:

said group III-V semiconductor is selected from the group consisting of gallium arsenide, gallium aluminum arsenide and indium gallium arsenide.

13. The process of claim 1 wherein:

said group III-V semiconductor substrate is gallium arsenide.

14. The process of forming a refractory metal ohmic contact on a group III-V semiconductor substrate comprising the steps of:

forming an implant-metalization mask on the group III-V semiconductor substrate with at least one window in said mask;

depositing a refractory metal selected from the group consisting of molybdenum, tungsten and tantalum through said window in said implant-metalization mask;

maintaining said implant-metalization mask on said group III-V semiconductor substrate;

implanting said group III-V semiconductor substrate with a group II metal ion selected from the group consisting of zinc, beryllium, cadmium and magnesium through both said window in said implant-metalization mask and said refractory metal to form an implanted conductive region in said group III-V semiconductor substrate below and in contact with said refractory metal whereby said refractory metal forms a refractory ohmic contact to said implanted conductive region of said group III-V semiconductor substrate; and subsequently thermally activating said implanted conductive region of said group III-V semiconductor substrate to enable said refractory ohmic contact to a specific contact resistance of less than about $10^{-6}$ ohms-cm$^2$.

15. The process for producing an ohmic contact on a gallium arsenide semiconductor substrate comprising the steps of:

applying an implant-metalization mask over said substrate, said mask including at least a silicon dioxide layer;

forming a window in said mask;

ion-implanting a group II metal selected from the group consisting of zinc, beryllium, cadmium and magnesium into the substrate through the windows in the mask to form a buried p-type contact region in said substrate;

maintaining said mask on said substrate;

depositing a refractory metal ohmic contact selected from the group consisting of molybdenum, tungsten and tantalum in said window in said mask to make electrical contact with the implanted p-type contact region within said substrate, said refractory metal ohmic contact deposition step performed either before the ion implantation or after the ion implantation; and subsequently thermally activating the metal in the implanted contact to enable said refractory ohmic contact to a specific contact resistance of less than about $10^{-6}$ ohms-cm$^2$.

16. The process of claim 15 further including the step of applying a passivation layer over the refractory metal ohmic contact prior to said thermal activation.

* * * * *